United States Patent
Stenberg et al.

(10) Patent No.: US 11,175,322 B2
(45) Date of Patent: Nov. 16, 2021

(54) GATING ENERGY CONSUMPTION ACCUMULATION BY DETECTING A FUNDAMENTAL COMPONENT OF A CURRENT

(71) Applicant: Landis+Gyr Innovations, Inc., Alpharetta, GA (US)

(72) Inventors: David Stenberg, Lafayette, IN (US); Frank J. Boudreau, Jr., Otterbein, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 117 days.

(21) Appl. No.: 16/721,026

(22) Filed: Dec. 19, 2019

(65) Prior Publication Data

US 2021/0190838 A1 Jun. 24, 2021

(51) Int. Cl.
*G01R 22/06* (2006.01)
*G01R 21/06* (2006.01)
(Continued)

(52) U.S. Cl.
CPC ........... *G01R 22/061* (2013.01); *G01R 21/06* (2013.01); *G01R 21/133* (2013.01); *G01R 22/10* (2013.01)

(58) Field of Classification Search
CPC ...... G01R 22/061; G01R 21/06; G01R 22/10; G01B 21/133
(Continued)

(56) References Cited

U.S. PATENT DOCUMENTS

| 4,056,774 A | 11/1977 | Shum |
| 5,300,924 A | 4/1994 | McEachern et al. |

(Continued)

FOREIGN PATENT DOCUMENTS

| CN | 106772212 A | 5/2017 |
| CN | 107861089 A | 3/2018 |

(Continued)

OTHER PUBLICATIONS

Carullo et al., "Power Meter for Highly Distorted Three-Phase Systems", IEEE Transactions on Instrumentation and Measurement, vol. 46, Issue 6, Dec. 1, 1997, pp. 1262-1267.
(Continued)

*Primary Examiner* — Tung X Nguyen
*Assistant Examiner* — Robert P Alejnikov, Jr.
(74) *Attorney, Agent, or Firm* — Kilpatrick Townsend & Stockton LLP

(57) ABSTRACT

Certain aspects and features include a system and method for energy measurement in electric meter systems. In an example, an electric meter receives an Alternating Current (A/C) signal. The electric meter includes a current measurement device that is configured to obtain a current measurement of a current of the A/C signal. The current measurement includes a fundamental frequency component and a noise component. The electric meter receives a current measurement signal from the current measurement device and filters the noise component from the current measurement, thereby creating a filtered current measurement signal. When the filtered current measurement signal is greater than a starting current threshold, the electric meter calculates an energy consumption measurement.

20 Claims, 5 Drawing Sheets

(51) Int. Cl.
*G01R 22/10* (2006.01)
*G01R 21/133* (2006.01)

(58) Field of Classification Search
USPC .............................................. 324/76.11, 74
See application file for complete search history.

(56) References Cited

U.S. PATENT DOCUMENTS

| | | | | |
|---|---|---|---|---|
| 5,485,393 | A | 1/1996 | Bradford | |
| 5,517,106 | A * | 5/1996 | Longini | G01R 21/133 324/103 R |
| 5,821,742 | A | 10/1998 | Carr et al. | |
| 6,611,772 | B1 * | 8/2003 | Lavoie | G01R 21/133 702/60 |
| 6,615,147 | B1 * | 9/2003 | Jonker | G01R 21/133 702/182 |
| 8,165,835 | B1 * | 4/2012 | Singh | G01R 21/1331 702/64 |
| 2006/0217907 | A1 * | 9/2006 | Long | G01R 21/133 702/61 |
| 2011/0010118 | A1 * | 1/2011 | Gaarder | G01R 21/133 702/60 |
| 2012/0278020 | A1 * | 11/2012 | Antonesei | G01R 23/02 702/75 |
| 2013/0113507 | A1 * | 5/2013 | Danesh | G01R 21/14 324/713 |
| 2013/0119972 | A1 * | 5/2013 | Maguire | G01R 35/04 324/74 |
| 2013/0176016 | A1 * | 7/2013 | Kang | H03M 3/472 324/142 |
| 2014/0253102 | A1 * | 9/2014 | Wood | G01R 23/02 324/140 R |
| 2016/0282391 | A1 * | 9/2016 | Quiquempoix | G01R 21/003 |
| 2017/0322283 | A1 | 11/2017 | Schweitzer et al. | |
| 2019/0037507 | A1 | 1/2019 | Shamir et al. | |
| 2019/0113551 | A1 * | 4/2019 | Stenberg | G01R 22/10 |
| 2020/0300958 | A1 * | 9/2020 | Boudreau, Jr. | G01R 22/10 |

FOREIGN PATENT DOCUMENTS

| | | |
|---|---|---|
| CN | 110082700 A | 8/2019 |
| DE | 2829588 A1 | 1/1980 |
| EP | 0092303 A1 | 10/1983 |
| EP | 0181719 A1 | 5/1986 |
| EP | 1538450 A1 | 6/2005 |
| FR | 2728074 A1 | 6/1996 |

OTHER PUBLICATIONS

Filipski, "System for Testing Wattmeters Under Nonsinusoidal Conditions", IEEE Transactions on Instrumentation and Measurement, vol. IM-36, Issue 2, Jun. 1, 1987, pp. 347-353.

PCT Patent Application No. PCT/US2020/065894, International Search Report and Written Opinion, dated Apr. 28, 2021, 18 pages.

ANSI C12.1-2014, American National Standard for Electric Meters—Code for Electricity Metering, National Electrical Manufacturers Association, 2016, 17 pages.

ANSI C12.20-2015, American National Standard for Electricity Meters—0.1, 0.2, and 0.5 Accuracy Classes, National Electrical Manufacturers Association, 2017, 2017, 9 pages.

* cited by examiner ates generally to resource distribution systems and more specifically to electric meters that accumulate energy consumption measurements by detecting a fundamental component of a current.

GATING ENERGY CONSUMPTION ACCUMULATION BY DETECTING A FUNDAMENTAL COMPONENT OF A CURRENT

TECHNICAL FIELD

This disclosure relates generally to resource distribution systems and more specifically to electric meters that accumulate energy consumption measurements by detecting a fundamental component of a current.

BACKGROUND

Electric metering systems measure power delivered to electrical loads such as air conditioners, televisions, lights, and the like. Different methods can be used to meter energy consumption. But in some cases, such as no-load scenarios, current measurements can include non-trivial harmonic or noise components that cause the meter to start measuring, or accumulating, energy consumption. For example, current flowing through an electric meter can include harmonics of a fundamental Alternating Current (A/C) frequency component or noise components generated from digital or other devices connected on the electrical line or from the electric meter itself.

Therefore, in some cases, metering devices can erroneously start to accumulate energy based on current flow attributable to current components other than components being consumed by an electrical load. Hence, a need exists for metering solutions.

SUMMARY

Certain aspects and features include a system and method for energy measurement in electric meter systems. In an example, an electric metering system is configured to receive an Alternating Current (A/C) signal from an electrical grid. The electric metering system includes a current measurement device that is configured to obtain a current measurement signal of a current of the A/C signal. The current measurement signal includes a fundamental frequency component and a noise component. The electric metering system further includes a voltage measurement device that is configured to a voltage measurement signal of a voltage of the A/C signal. The electric metering system further includes a processor configured to perform operations. The operations include receiving a current measurement signal from the current measurement device. The operations further include filtering the noise component from the current measurement signal, thereby creating a filtered current measurement signal. The operations further include obtaining the voltage measurement signal from the voltage measurement device when the filtered current measurement is greater than a starting current threshold and calculating an energy consumption measurement from the voltage measurement and the filtered current measurement signal.

Other aspects include a system and method for energy measurement in electric meter systems. In an example, an electric metering system is configured to receive an Alternating Current (A/C) signal from an electrical grid. The electric metering system includes a current measurement device that is configured to obtain a current measurement signal of a current of the A/C signal. The current measurement signal includes a fundamental frequency component and a noise component. The electric metering system further includes a voltage measurement device that is configured to a voltage measurement signal of a voltage of the A/C signal. The electric metering system further includes a processor configured to perform operations. The operations include receiving a current measurement signal from the current measurement device. The operations further include filtering the noise component from the current measurement signal, thereby creating a filtered current measurement signal. The operations further include obtaining the voltage measurement signal from the voltage measurement device when the filtered current measurement is greater than a starting current threshold and calculating an energy consumption measurement from the voltage measurement and the current measurement signal.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Figure 1:
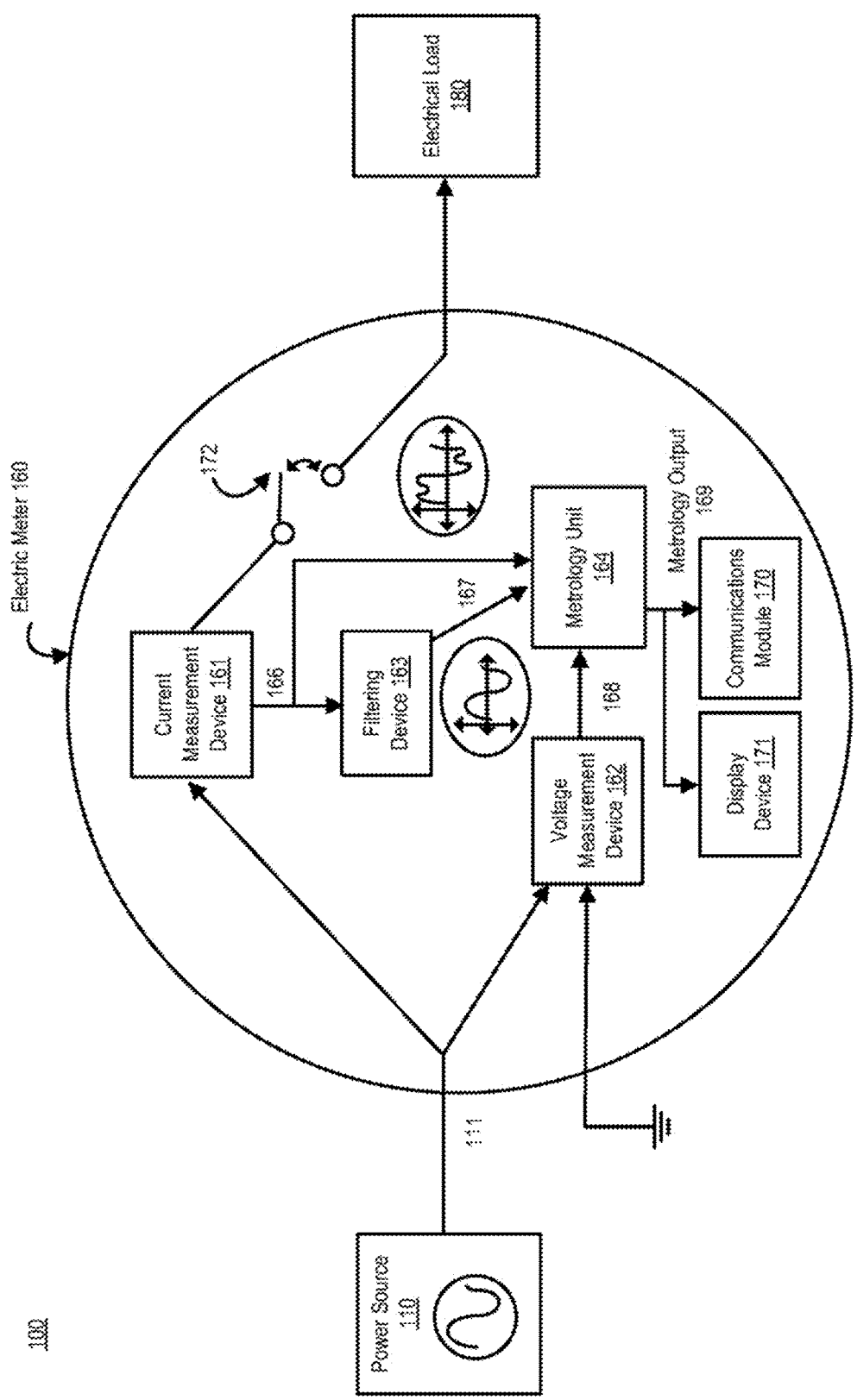
FIG. 1 illustrates an exemplary electric meter, according to an aspect of the present disclosure.

Aspects of the present disclosure relate to improved electric metering systems (or electric meters) that more accurately measure energy consumption. As discussed above, existing electric meters can sometimes erroneously accumulate an energy measurement due to current measurements that include contributions from noise. As further discussed, disclosed solutions can be configured to operate in fundamental-only metering environments or broadband metering environments.

More specifically, an electric meter is generally expected to start measuring energy accurately at a specified current starting current threshold. The electric meter also is expected to not accumulate energy when no load is applied. But noise can cause a current to be measured and therefore energy to also be registered, or accumulated, by the meter. Noise can include all types of non-fundamental frequency components such as switching noise, white noise, or undesired harmonic components. Sources of noise include, but are not limited to, switching power supplies, integrated circuits, and radios. Such sources can be internal to the meter, external to the meter, or both.

The requirement that no energy be accumulated when no load is applied to the meter can be more acute given expectations for modern electric meters, which can sometimes include an accurate measurement of energy over a range of 10,000:1 with a current measurement with a range of 1,500:1. In particular, at a very low current level or in a no-load condition, the contribution of current flow due to noise sources can be greater than the contribution of the fundamental component of the current. Therefore, with small amounts of current flow, error sources can be particularly problematic.

Traditionally, to avoid measuring energy when a meter has no load attached, electric meters use a predefined starting current threshold (e.g., 50 milli-Amperes), below which current that is detected does not trigger an energy measurement. A starting current threshold can be set higher than an expected noise level to mitigate the effects of a presence of noise. Other techniques include recording a typical current as measured under no load conditions and constantly applying a negative offset of this magnitude to the current measurement. But these approaches can still lead to inaccuracies. For example, when a starting current threshold is set too high, the electric meter may not start measuring at a sufficiently low starting current. In this case, the meter is therefore less able to distinguish between a noisy no-load condition and a low load condition and may be less accurate. Conversely, when the starting current threshold is set too low, a meter might accumulate energy during a no-load condition.

Accordingly, disclosed systems receive a measurement of current from a current sensor and remove harmonic content and noise from the current measurement. In an aspect, energy accumulation can be started based on the filtered measurement that includes only the fundamental component but energy accumulation can be calculated based on either a fundamental-only energy measurement or a broadband energy measurement (e.g., including harmonic content). In some cases, a starting threshold current is still used, above which energy consumption measurements are accumulated and below which no energy consumption measurements are accumulated.

Turning now to the figures, FIG. 1 illustrates an exemplary electric meter, according to an aspect of the present disclosure. FIG. 1 depicts electric meter environment 100, which is an example of an environment in which an electric meter can be deployed. Electric meter environment 100 includes one or more of power source 110, electric meter 160, and electrical load 180. Electric meter 160 and electrical load 180 can be located at a premises such as a home or business. Examples of electrical loads include air conditioners, lights, and industrial equipment.

Power source 110 provides alternating current (A/C) signal 111 to electric meter 160. Examples of power sources include power generation stations, portable generators, and feeders from electrical substations. A/C signal 111 can include not only a fundamental component (e.g., 50 Hertz or 60 Hertz) but also one or more harmonic frequencies, for example, caused by non-linear electrical loads. For example, A/C signal 111 could be 120 Volts at 60 Hz, but also include a third harmonic at 180 Hz.

Additionally or alternatively, A/C signal 111 can include noise. Noise can be created anywhere on an electrical line, such as at one or more positions in circuits connected to electric meter 160 or the electric meter 160 itself. Examples of circuits that can cause such noise are digital circuits with high speed clocks or high speed buses. Generated noise can be additive (add to a current component) or subtractive (subtract from a current component). Generated noise can have any distribution such as a random distribution or have a bias.

Electric meter 160 includes one or more of current measurement device 161, voltage measurement device 162, filtering device 163, metrology unit 164, display device 171, communications module 170 and switch 172. Electric meter 160 distributes A/C signal 111 to current measurement device 161, which in turn provides the A/C signal to electrical load 180. Metrology unit 164 can measure parameters such as power consumption, energy consumption, current, voltage, and the like.

In some cases, electric meter 160 includes switch 172. Switch 172 is controllable by electric meter 160 to be in an open or closed position. In the open position, the electrical load 180 is not connected. In the closed position, electric meter 360 can apply an incoming A/C signal to electrical load 180.

Current measuring device 161 includes components, devices, or circuits to measure the current flowing between power source 110 and electrical load 180. Current measuring device 161 can measure a current flowing from power source 110 to electrical load 180 including fundamental frequency components, and noise or harmonics of the fundamental frequency (if any). Current measuring device 161 provides current measurement signal 166 to filtering device 163 and to metrology unit 164.

Current measuring device 161 can use any standard techniques to measure current. For example, either direct or indirect current sensing can be used. With direct current sensing, current measurement device 161 includes a shunt resistor that is connected in series with the current flowing from the power source 110 to electrical load 180 (e.g., generated from the A/C signal plus any additional noise or harmonics). The current measuring device 161 then measures a voltage that is across the shunt resistor, which is proportional to the current. From the measured voltage, current measuring device 161 then determines the current. With indirect current sensing, current measuring device 161 includes a coil that is located next to the wire conducting current from power source 110 to electrical load 180. The current flow induces a voltage to flow across the coil. Current measuring device 161 measures the induced voltage, which is proportional to the current. From the measured voltage, current measuring device 161 then determines the current.

Voltage measurement device 162 includes components, devices or circuits to measure a voltage applied to electrical load 180 by power source 110. Examples of typical voltages are 110 Volts and 220 Volts, but other voltages are possible. Standard voltage measurement techniques can be used. Voltage measurement device 162 outputs voltage measurement signal 168, which can represent a fundamental voltage component with or without harmonic voltage components.

To remove undesired components, filtering device 163 can use any standard filtering techniques. Filtering can remove frequencies that are above and/or below the fundamental component. Either analog filters, digital filters, or both can be used. For example, suitable analog filters are high-pass filters, low-pass filters, or band-pass filters. Filtering device 163 can also sample and quantize the current measurement signal 166 then perform filtering in the digital domain. Examples of digital filters include Infinite Impulse Response (IIR) or Finite Impulse Response (FIR) filters. Filtering device 163 outputs filtered current measurement signal 167. In some cases, filtering device 163 can also be used to filter the voltage measurement signal 168 obtained from voltage measurement device 162.

Metrology unit 164 performs metrology functions based on voltage and/or current measurements and outputs metrology output 169. Metrology output 169 can include power consumption, energy consumption, and other metrics. Metrology unit 164 can be partially or wholly implemented in software (e.g., on a computing device with a processor). An example of a suitable computing device is discussed with respect to FIG. 5.

Further, metrology unit 164 can operate in a fundamental-only measuring mode or a broadband measuring mode. For example, some geographic territories require the measurement of only a fundamental component (e.g. 50 Hz or 60 Hz) of current and voltage, whereas others may permit measuring broadband components or noise. Broadband components can include harmonics (e.g., 100 Hz, 120 Hz, etc.) and/or non-harmonic frequencies. In fundamental-only mode, metrology unit 164 can calculate energy consumption by computing the energy contributions of only fundamental voltage and current components of the signal (e.g., by using filtered current measurement signal 167 and voltage measurement signal 168). In this mode, any power consumption contributions of harmonic components that are present are disregarded. In contrast, in broadband mode, metrology unit 164 can calculate energy consumption by computing energy contributions of all components of the voltage and current measurements (e.g., by using current measurement signal 166 and voltage measurement signal 168).

But irrespective of whether metrology unit 164 is configured in fundamental-only or broadband mode, metrology unit 164 accumulates energy measurements by analyzing the fundamental current component (e.g., via filtered current measurement signal 167). In some cases, a starting current threshold can be used to determine when to start to measure energy or power consumption. An example of one approach is discussed with respect to FIG. 2.

Display device 171, which is optionally included in electric meter 160, receives metrology output 169. Display device 171 can be located on the interior or exterior of electric meter 160 and can be any suitable display technology such as a Liquid Crystal Display (LCD), a Light Emitting Diode (LED) display, or a bank of LED lights. Display device 171 can indicate any of the metrics determined by electric meter 360 such as power consumption, energy consumption, voltage, current, cost, or meter status (e.g., whether the meter is properly functioning).

Communications module 170, which is optionally included in electric meter 160, receives metrology output 169. Communications module 170 can include one or more wireless or wired transceivers. In turn, communications module 170 can transmit metrology output 169 to an external device or network (e.g., a head end system or Wireless network). Communications module 170 can also receive data or control signals from an external device or network (e.g., from a head end system or a Wireless network). Examples of control signals include causing a meter connect or disconnect, or causing the communications module 170 to transmit updated meter data such as updated metrology output 169.

Figure 2:
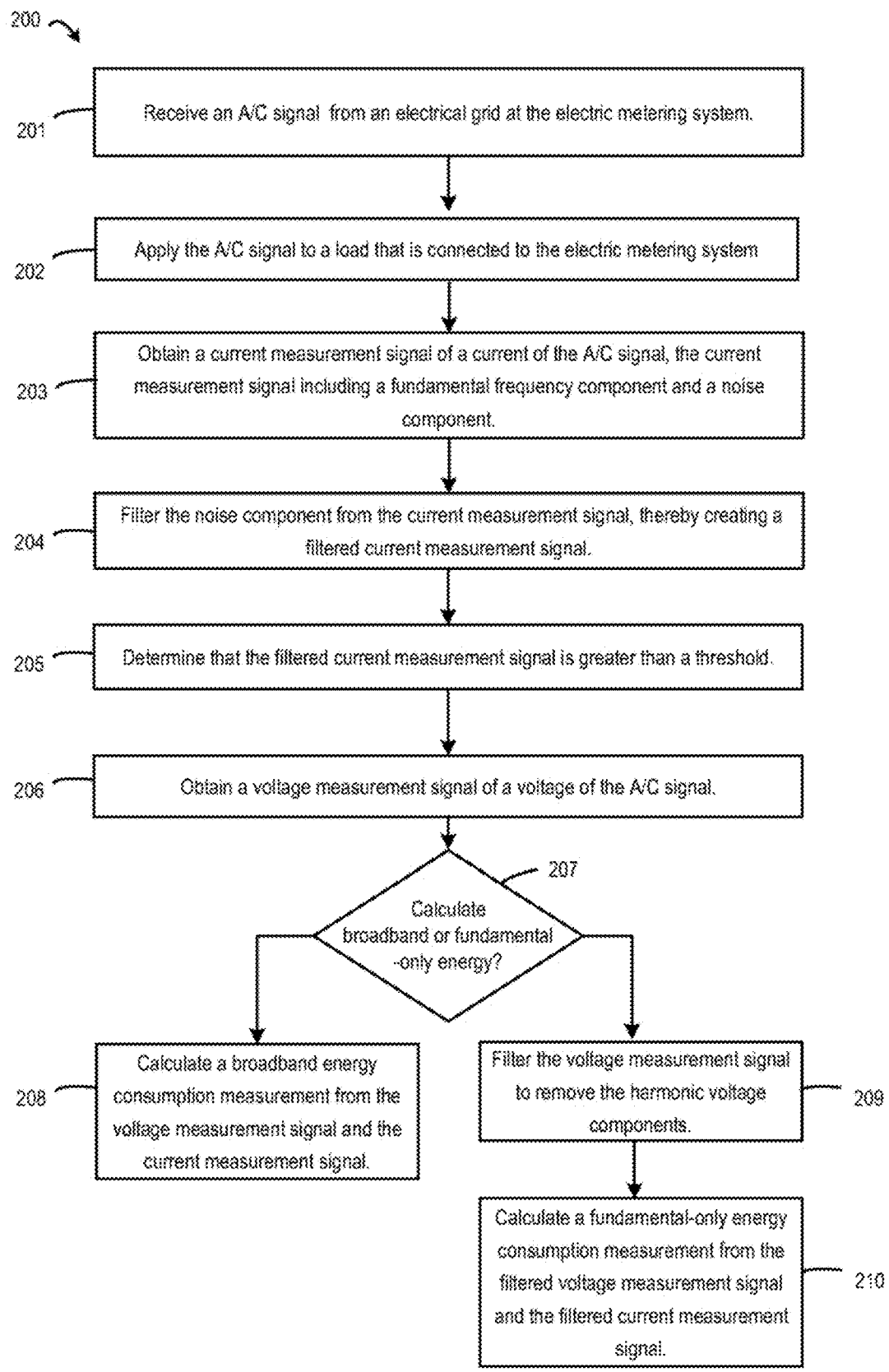
FIG. 2 is a flowchart illustrating an exemplary process for measuring energy consumption in an electric metering device, according to an aspect of this disclosure.

FIG. 2 is a flowchart illustrating an exemplary process 200 for measuring energy consumption in an electric metering device, according to an aspect of this disclosure. Process 200 is discussed with respect to FIG. 1, but can be implemented on any suitable electric meter.

At block 201, process 200 involves receiving an A/C signal from an electrical grid at the electric metering system. For example, referring back to FIG. 1, electric meter 160 receives A/C signal 111 from power source 110. The A/C signal 111 includes a fundamental component (e.g., 50 Hz or 60 Hz) and may include harmonic or noise content.

At block 202, process 200 involves applying A/C signal 111 to a load that is connected to the electric metering system. If electric meter 160 is installed at an end user premises, electric meter 360 can automatically apply A/C signal 111 to a load. For example, electric meter 160 provides A/C signal 111 to electrical load 180 by closing switch 172. Completing the circuit with electrical load 180 can cause a current to flow based on A/C signal 111 (e.g., from the power source 110, through electric meter 160, through electrical load 180, and back). If electric meter 160 is not installed or is within a testing environment (e.g., as described with respect to FIGS. 3 and 4), electric meter 160 may not automatically apply an A/C signal to a load but instead remain open.

At block 203, process 200 involves obtaining a current measurement signal of a current of the A/C signal, where the current measurement signal includes a fundamental frequency component and a noise component. Current measuring device 161 measures A/C signal 111 and generates a current measurement signal 166. The current measurement signal 166 can include a fundamental frequency component and harmonic or noise components.

At block 204, process 200 involves filtering the noise component from the current measurement signal, thereby creating a filtered current measurement. Current measurement device 161 provides the current measurement signal 166 to filtering device 163, which in turn filters the current measurement signal 166 to remove or substantially remove non-fundamental components. Filtering device 163 outputs filtered current measurement signal 167.

At block 205, process 200 involves determining that the filtered current measurement signal is greater than a starting current threshold. Metrology unit 164 receives filtered current measurement signal 167 and determines whether the filtered current measurement signal 167 is greater than a threshold.

The current threshold indicates when to start measuring energy consumption. The starting current threshold can be determined in different ways. In some cases, this threshold can be set by a standard. Examples of standards include the American National Standards Institute (ANSI) C12.1 and C12.20. In other cases, the threshold can be determined experimentally. An example of a system suitable to make such a determination is discussed with respect to FIG. 3.

In an aspect, metrology unit 164 calculates a Total Harmonic Distortion (THD) level from the filtered current measurement signal. Metrology unit 164 then compares the THD level against a threshold, which can be different than the starting current threshold discussed with respect to block 205. If the THD level is greater than the threshold, then process 200 moves to block 206.

In another aspect, metrology unit 164 calculates a THD level broadband magnitude of the current. Metrology unit 164 then compares the THD level against a threshold, which can be different than the starting current threshold discussed with respect to block 205. If the THD level is greater than the threshold, then process 200 moves to block 206.

In a further aspect, metrology unit 164 calculates a Fourier transform (e.g., Fast Fourier Transform or Discrete Fourier Transform) of the current measurement signal 166. Metrology unit 164 obtains an amplitude of the fundamental component by using the frequency domain representation. Metrology unit 164 compares the amplitude against a threshold, which can be different than the starting current threshold discussed with respect to block 205. If the amplitude is greater than the threshold, then process 200 moves to block 206.

Metrology unit 164 can detect that filtered current measurement signal 167 is greater than a threshold and then to perform measurements such as accumulating energy. In contrast, when the filtered current measurement signal 167 is less than the threshold, metrology device may not accumulate energy measurements.

Aspects described herein apply to both single-phase and poly-phase electric meters. In the case of a poly-phase meter (e.g., a two or three phase meter), each phase can be independently analyzed (e.g., via process 200) and energy accumulated for each phase independent of the other phases. For example, metrology unit 164 can detect fundamental-frequency current flow on a first phase while not detecting any current flow on a second phase. Hardware components of electric meter 160 can be duplicated as necessary for each phase.

At block 206, process 200 involves obtaining a voltage measurement signal of a voltage of the A/C signal. Metrology unit 164 obtains a voltage measurement signal 168 from voltage measurement device 162.

At block 207, process 200 involves determining whether to calculate a broadband energy calculation or a fundamental-only energy calculation. In metering systems which require a broadband energy consumption (e.g., including both fundamental and broadband components of both current and voltage) to be calculated, process 200 proceeds to block 208. In contrast, in metering solutions that require a fundamental energy consumption to be measured (e.g., based on a fundamental-only current measurement and a fundamental-only voltage measurement), process 200 proceeds to block 209.

At block 208, process 200 involves calculating a broadband energy consumption measurement from the voltage measurement signal and the current measurement signal. For example, metrology unit 164 calculates an energy consumption value from voltage measurement signal 168 and current measurement signal 166. Metrology unit 164 can accumulate energy consumption measurements over a period of time to determine an energy consumption measurement. Examples of periods of time are 100 microseconds to 1 second. Process 200 (e.g., blocks 201-208) can be repeated for successive time intervals.

At block 209, process 200 involves filtering the voltage measurement signal to remove harmonic voltage components. In an aspect, metrology unit 164 calculates fundamental-only energy consumption measurements. In this case, metrology unit 164 filters voltage measurement signal 168 to remove harmonic voltage components.

At block 210, process 200 involves calculating a fundamental-only energy consumption measurement from the filtered voltage signal and the filtered current signal. Metrology unit 164 calculates an energy consumption value from the filtered voltage measurement signal 168 generated at block 209 and filtered current measurement signal 167. Metrology unit 164 can accumulate energy consumption measurements over a period of time to determine an energy consumption measurement. Examples of periods of time are 100 microseconds to 1 second. Process 200 (e.g., blocks 201-210) can be repeated for successive time intervals.

In an aspect, metrology unit 164 does not use a current threshold, but instead calculates energy then uses an energy consumption threshold. For example, metrology unit 164 can start to accumulate an energy consumption after determining that an initial energy calculation exceeds a energy consumption threshold. In this case, metrology unit 164 executes blocks 201-204, obtaining the filtered current measurement signal. Then, instead of executing block 205, metrology unit proceeds to block 206, obtaining a voltage measurement signal. Then, metrology unit 164 proceeds to block 207 and based on whether a broadband or a fundamental-only energy measurement is required, executes either block 208 or blocks 209-210 respectively. The energy calculation determined at either block 208 or block 210 is then compared with an energy consumption threshold. If the energy measurement is greater than the energy consumption threshold, then metrology unit 164 starts to accumulate, or store, the energy consumption value. Conversely, if the energy measurement is less than the energy consumption threshold, then metrology unit 164 does not accumulate an energy measurement.

For example, metrology unit 164 can calculate a fundamental-only power contribution. Metrology unit 164 can then compare these calculations against one or more thresholds to determine when to start accumulating energy. The fundamental-only power consumption can be calculated as the product of the root-mean-squared (RMS) voltage, the RMS current, and a cosine of the power factor (the phase angle between the current and the voltage).

In another example, metrology unit 164 calculates a fundamental-only Volt-Ampere reactive (apparent) power consumption. Apparent power consumption is calculated as a product of the root-mean-squared (RMS) voltage and the RMS current. A fundamental-only apparent power consumption is a product of the RMS of the fundamental-only voltage the RMS of the fundamental only current (filtered current measurement signal 167). Metrology unit 164 calculates the apparent power consumption against a power consumption threshold. If the power consumption threshold is exceeded, then metrology unit 164 accumulates the power consumption measurement. If the power consumption threshold is not exceeded, then metrology unit 164 does not accumulate the power consumption measurement. Various methods can be used to remove non-fundamental components of a voltage or current measurement, such as those discussed with respect to block 205.

Before an electric meter is deployed to an end user premises, it is tested to ensure accurate measurement of current flow and energy consumption. Some aspects of the present disclosure relate to no-load testing of electric meters. During a no-load test, current measurement circuits of a meter are open-circuited and a voltage is applied to the electric meter.

Figure 3:
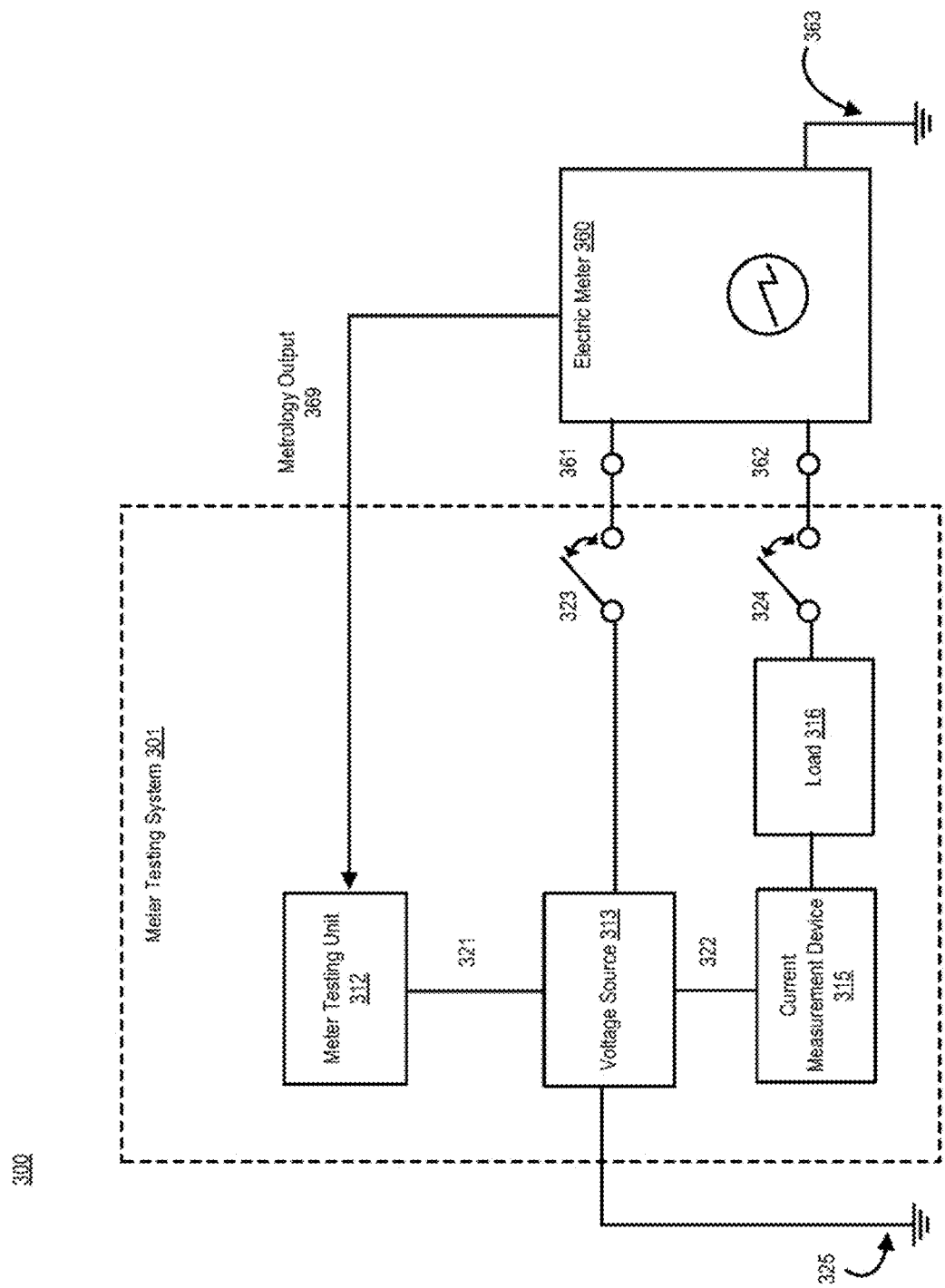
FIG. 3 illustrates an exemplary electric meter testing system, according to an aspect of the present disclosure.

When no load is applied, the electric meter should measure zero current flow and therefore zero energy accumulation. However in some cases, a small tolerance of current flow may be acceptable. Therefore, over a time period of energy measurements, the meter should accumulate (or measure) only a minimal amount of energy. If during a no-load test, a meter accumulates more than a threshold or tolerance of energy, then the meter may be defective or need adjustment. FIG. 3 depicts an example of a system that can be used for performing a no-load test.

FIG. 3 illustrates an exemplary electric meter testing system, according to an aspect of the present disclosure. FIG. 3 depicts testing environment 300, which includes meter testing system 301 and electric meter 360. In the example depicted by FIG. 3, meter testing system 301 can test electric meter 360. Testing environment 300 is suitable for performing a no-load test on electric meter 360, for independent verification of a current measurement signal received from electric meter 360, or for determination of a suitable starting current threshold.

Electric meter 360 includes terminal 361, ground 363, and metrology output 369. Electric meter 360 can be connected to meter testing system 301 via terminal 361. Electric meter 360 is an example of electric meter 160, depicted in FIG. 1.

Meter testing system 301 includes voltage source 313, current measurement device 315, load 316, meter testing unit 312, switch 323, switch 324, and ground 325. Meter testing unit 312 is connected to voltage source 313 via line 321. Voltage source 313 is connected to current measurement device 315 via line 322. Voltage source 313 is a precise voltage source that can generate one or more fundamental or wideband voltages. The generated voltage can be controlled independently to apply to the meter under test. Each voltage waveform can includes a fundamental frequency (e.g., 60 Hz) and one or more harmonics. The generated voltages can also include noise intentionally generated by voltage source 313 for testing purposes. Current measurement device 315 can measure any current flowing through electric meter 360. Load 316 can be configured to be one of a selection of loads including resistive, reactive, or both. Switches 323 and 324 can cause the connection or disconnection of electric meter to the meter testing system 301 by connecting or disconnecting terminal 361.

In a no-load test, terminal 362 can be left open-circuited. Alternatively, electric meter 360 can be connected via terminals 361 and 362 to meter testing system 301 but switch 324 is left open, causing an open-circuit on terminal 361. During a no-load test, electric meter 360 provides metrology output 369 to meter testing unit 312, which in turn verifies that the energy consumption measurement of metrology output 369 is either zero or minimal, thereby fulfilling the requirements of a no-load test. During no-load testing, electric meter 360 can be powered by terminal 361 or by an external source.

In another use case, meter testing system 301 can independently verify a current measurement from the electric meter. For example, meter testing system 301 can close switch 323, thereby applying a voltage from voltage source 313 to electric meter 360 and load 316. Then, meter testing system 301 can compare a current measurement signal received from electric meter 360, e.g., from metrology output 369, with an expected current measurement. e.g., measured by current measurement device 315. For example, if electric meter 360 is not operating correctly, the measured current signal from electric meter 360 may be inconsistent with the expected current from current measurement device 315.

In yet another use case, meter testing system 301 can be used to determine a suitable starting current threshold. In this case, meter testing system 301 can provide electric meter with different, causing a current to be measured by electric meter 360 for each load. Each load can have a different expected current flow. The current corresponding with the smallest load that is verified as correct can be used as the threshold, subject to regulatory requirements.

Figure 4:
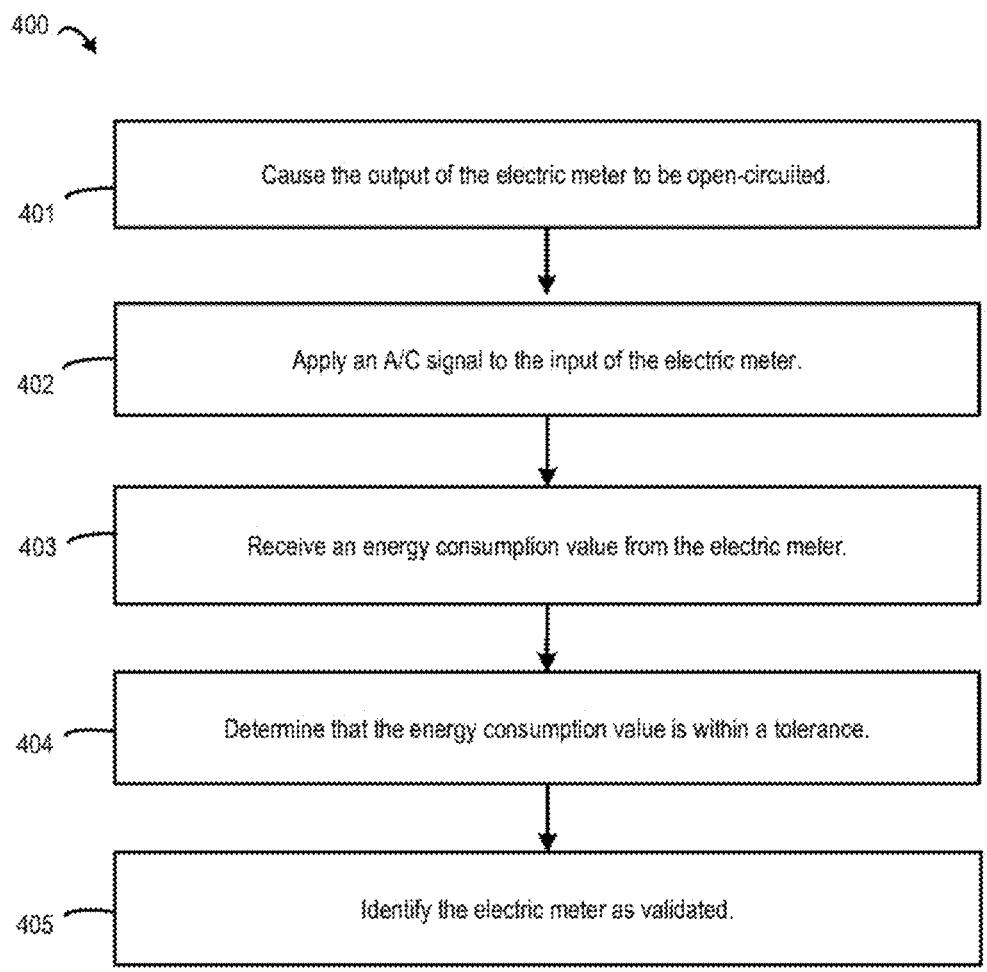
FIG. 4 is a flowchart illustrating an exemplary process for validating an electric metering device, according to an aspect of this disclosure.

FIG. 4 is a flowchart illustrating an exemplary process 400 for validating an electric metering device, according to an aspect of this disclosure.

At block 401, process 400 involves causing the output of the electric meter to be open-circuited. Referring back to FIG. 3, meter testing unit 312 causes electric meter 360 to be open-circuited to facilitate a no-load test or opens switch 323.

At block 402, process 400 involves applying an A/C signal to the input of the electric meter. Voltage source 313 applies an A/C signal to electric meter 360. The A/C signal is in turn provided to terminal 361 of electric meter 360.

At block 403, process 400 involves receiving an energy consumption value from the electric meter. Meter testing system 301 receives the metrology output 369, which includes energy consumption.

At block 404, process 400 involves determining that the energy consumption value is within an expected tolerance. The tolerance can be based on an independently calculated energy consumption value. For example, meter testing unit 312 can receive an independently-measured current measurement value from current measurement device 315. Meter testing unit 312 calculates an energy consumption value based on the voltage of the A/C signal applied by voltage source 313 and the measured current measurement value.

At block 405, process 400 involves identifying the meter as validated. When the energy consumption value is within the tolerance, then the meter is identified as passing the no-load test.

Figure 5:
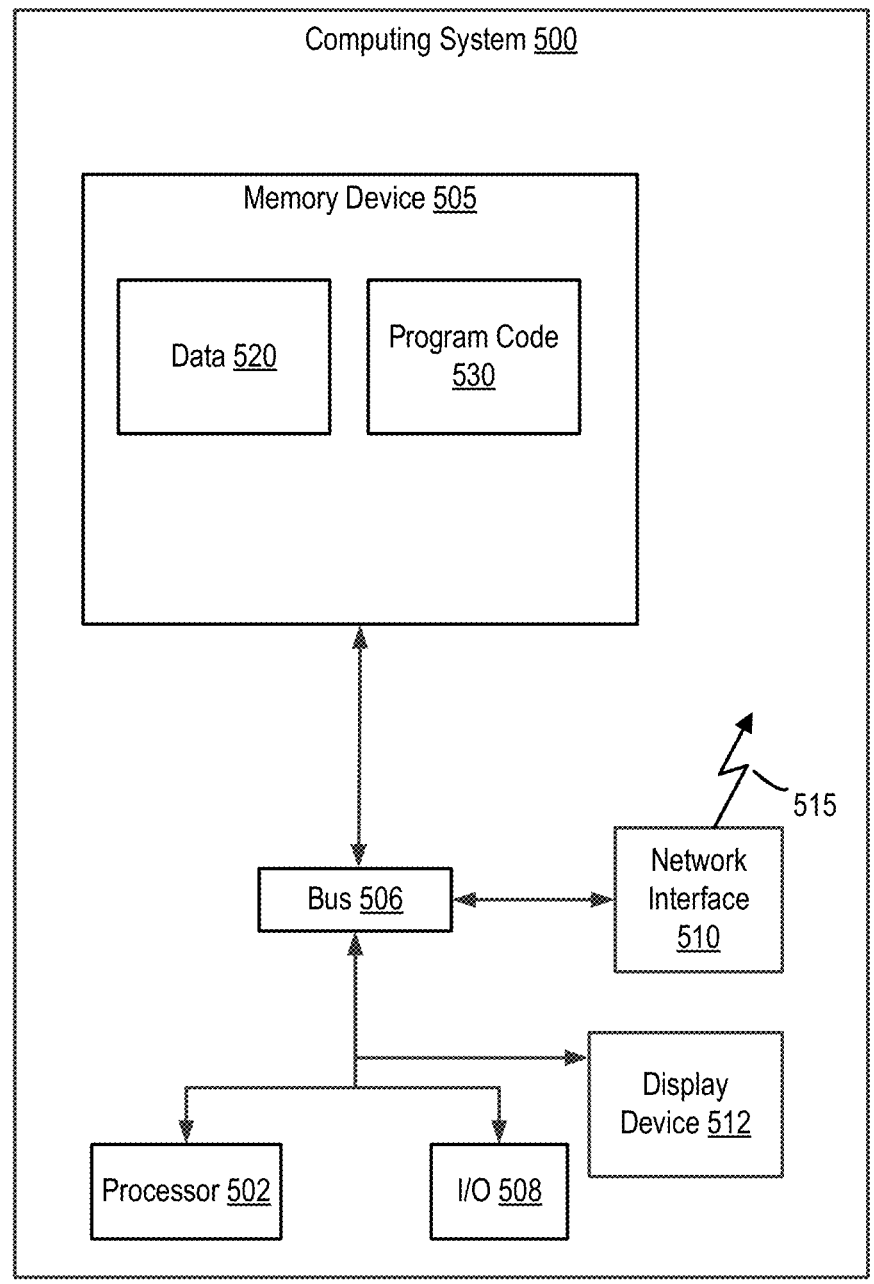
FIG. 5 illustrates an exemplary computing device, according to an aspect of the present disclosure.

FIG. 5 illustrates an exemplary computing device 500. Computing device 500 can implement functionality described herein such as software functionality of metrology unit 164 or meter testing unit 312. Computing device 500 includes a processor 502 communicatively coupled to one or more memory devices 505. The processor 502 executes computer-executable program code 530 stored in a memory device 505, accesses data 520 stored in the memory device 505, or both. Examples of the processor 502 include a microprocessor, an application-specific integrated circuit ("ASIC"), a field-programmable gate array ("FPGA"), or any other suitable processing device. The processor 502 can include any number of processing devices or cores, including a single processing device. The functionality of the computing device may be implemented in hardware, software, firmware, or a combination thereof.

The memory device 505 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 500 may also include a number of external or internal devices, such as input or output devices. For example, the computing device 500 is shown with one or more input/output ("I/O") interfaces 508. An I/O interface 508 can receive input from input devices or provide output to output devices. One or more buses 506 are also included in the computing device 500. The bus 506 communicatively couples one or more components of a respective one of the computing device 500.

The computing device 500 executes program code 530 that configures the processor 502 to perform one or more of the operations described herein. For example, the program code 530 causes the processor to perform the operations described in FIG. 3.

The computing device 500 also includes a network interface device 510. The network interface device 510 includes any device or group of devices suitable for establishing a wired or wireless data connection to one or more data networks. The network interface device 510 may be a wireless device and have an antenna 515. The computing device 500 can communicate with one or more other computing devices implementing the computing device or other functionality via a data network using the network interface device 510.

The computing device 500 can also include a display device 512. Display device 512 can be a LCD, LED, touch-screen or other device operable to display information about the computing device 500. For example, information could include an operational status of the computing device, network status, etc.

General Considerations

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method of measuring energy in an electric metering system, the method comprising:
    receiving, at the electric metering system and from an electrical grid, an A/C signal;
    obtaining a current measurement signal of a current of the A/C signal, wherein the current measurement signal includes a fundamental frequency component and a noise component;
    filtering the noise component from the current measurement signal, thereby creating a filtered current measurement signal; and
    when the filtered current measurement signal is greater than a starting current threshold:
        obtaining a voltage measurement signal of a voltage of the A/C signal; and
        calculating an energy consumption measurement from the voltage measurement signal and the current measurement signal.

2. The method of claim 1, further comprising:
    applying the A/C signal to a load that is connected to the electric metering system.

3. The method of claim 1, further comprising:
    when the filtered current measurement signal is less than the starting current threshold, outputting a zero energy consumption value.

4. The method of claim 1, wherein calculating the energy consumption measurement comprises:
    accumulating, over a period of time, a plurality of power consumption measurements; and determining an energy consumption by integrating the plurality of power consumption measurements.

5. The method of claim 1, wherein the noise component comprises one or more harmonic components of the fundamental frequency component.

6. The method of claim 1, wherein the noise component is generated from an electric circuit.

7. The method of claim 1, wherein the voltage measurement signal comprises a voltage noise component, the method further comprising filtering the voltage measurement signal to remove any harmonic voltage components, thereby creating a filtered voltage component, and wherein the energy consumption measurement is calculated based on the filtered voltage component.

8. A method of measuring energy in an electric metering system, the method comprising:
    receiving, at the electric metering system and from an electrical grid, an A/C signal;
    applying the A/C signal to a load that is connected to the electric metering system;
    obtaining a current measurement signal of a current of the A/C signal, wherein the current measurement signal includes a fundamental frequency component and a noise component;
    filtering the noise component from the current measurement signal, thereby creating a filtered current measurement signal;
    obtaining a voltage measurement of the A/C signal;
    calculating an energy consumption measurement from the voltage measurement and the current measurement signal; and
    when the energy consumption measurement is greater than an energy consumption threshold, accumulating the energy consumption measurement.

9. The method of claim 8, wherein calculating the energy consumption measurement comprises:
    filtering the voltage measurement of the A/C signal to remove a noise voltage component, thereby creating a filtered voltage component; and
    calculating, from the filtered voltage component and the filtered current measurement signal, a fundamental-only energy consumption measurement.

10. The method of claim 8, wherein calculating the energy consumption measurement comprises:
    filtering the voltage measurement of the A/C signal to remove a noise voltage component, thereby creating a filtered voltage measurement signal; and
    calculating, from the filtered voltage measurement signal and the filtered current measurement signal, a volt-ampere (VA) reactive energy consumption measurement.

11. The method of claim 8, wherein calculating the energy consumption measurement comprises:
    calculating a volt-ampere (VA) root-mean-squared (RMS) power consumption of the filtered current measurement signal.

12. An electric metering system comprising:
    a current measurement device configured to obtain a current measurement signal of a current of an A/C signal, wherein the current measurement signal includes a fundamental frequency component and a noise component;
    a voltage measurement device configured to a voltage measurement signal of a voltage of the A/C signal; and
    a processor configured to perform operations comprising:
        receiving, from the current measurement device, the current measurement signal;
        filtering the noise component from the current measurement signal, thereby creating a filtered current measurement signal; and
        when the filtered current measurement signal is greater than a starting current threshold:
            obtaining the voltage measurement signal from the voltage measurement device; and
            calculating an energy consumption measurement from the voltage measurement signal and the filtered current measurement signal.

13. The electric metering system of claim 12, wherein the electric metering system is configured to apply the A/C signal to a load that is connected to the electric metering system.

14. The electric metering system of claim 12, wherein the operations further comprise:

when the filtered current measurement signal is less than the starting current threshold, outputting a zero energy consumption value.

15. The electric metering system of claim 12, wherein calculating the energy consumption measurement comprises:
accumulating, over a period of time, a plurality of power consumption measurements; and determining an energy consumption by integrating the plurality of power consumption measurements.

16. The electric metering system of claim 12, wherein calculating the energy consumption measurement comprises:
calculating a volt-ampere (VA) root-mean-squared (RMS) power consumption of the filtered current measurement signal.

17. The electric metering system of claim 12, wherein the noise component comprises one or more harmonic components of the fundamental frequency component.

18. The electric metering system of claim 12, wherein the noise component is generated from an electric circuit.

19. The electric metering system of claim 12, wherein the voltage measurement signal comprises a voltage noise component, wherein the operations further comprise filtering the voltage measurement signal to remove the noise voltage component thereby creating a filtered voltage component, and wherein the operations further comprise calculating the energy consumption measurement based on the filtered voltage component.

20. An electric meter testing environment comprising:
an electric meter comprising:
an input configured to receive an A/C signal;
a current measurement device configured to obtain a current measurement signal of a current of the A/C signal, wherein the current measurement signal includes a fundamental frequency component and a noise component;
a filter configured to filter the noise component from the current measurement signal, thereby creating a filtered current measurement signal;
a processor configured to determine, from the filtered current measurement signal and a voltage of the A/C signal, an energy consumption measurement; and
an output configured to provide the A/C signal to a load; and
a meter testing device configured to:
cause the output of the electric meter to be open-circuited;
apply the A/C signal to the input of the electric meter;
receive, from the electric meter, the energy consumption measurement; and
responsive to determining that the energy consumption measurement is within a tolerance of an expected energy consumption measurement, identify the electric meter as validated.

* * * * *